United States Patent [19]
Nakazawa

[11] Patent Number: 5,288,651
[45] Date of Patent: Feb. 22, 1994

[54] METHOD OF MAKING SEMICONDUCTOR INTEGRATED CIRCUIT DEVICE INCLUDING BIPOLAR TRANSISTORS, MOS FETS AND CCD

[75] Inventor: Hiroyuki Nakazawa, Kawasaki, Japan

[73] Assignee: Kabushiki Kaisha Toshiba, Kawasaki, Japan

[21] Appl. No.: 914,587

[22] Filed: Jul. 20, 1992

Related U.S. Application Data

[62] Division of Ser. No. 609,623, Nov. 6, 1990, abandoned.

[30] Foreign Application Priority Data

Nov. 9, 1989 [JP] Japan .................. 1-291714

[51] Int. Cl.$^5$ ........................... H01L 21/265
[52] U.S. Cl. ........................... 437/31; 437/53; 437/59
[58] Field of Search ............ 437/53, 59, 54, 56, 437/57, 58, 31

[56] References Cited

U.S. PATENT DOCUMENTS

| | | | |
|---|---|---|---|
| 4,152,715 | 5/1979 | Wang | 257/251 |
| 4,253,168 | 2/1981 | Petrosky et al. | 257/240 |
| 4,314,857 | 2/1982 | Aitken | 437/34 |
| 4,686,554 | 8/1987 | Ohmi et al. | 257/443 |
| 4,799,098 | 1/1989 | Ikeda et al. | 257/370 |
| 4,908,518 | 3/1990 | Losee et al. | 257/221 |
| 4,912,054 | 3/1990 | Tomassetti | 437/31 |
| 4,994,888 | 2/1991 | Taguchi et al. | 257/378 |
| 5,026,654 | 6/1991 | Tanba et al. | 437/31 |
| 5,060,044 | 10/1991 | Tomassetti | 357/370 |

FOREIGN PATENT DOCUMENTS

| | | |
|---|---|---|
| 193934A2 | 5/1986 | European Pat. Off. |
| 193934A3 | 9/1986 | European Pat. Off. |
| 250721A2 | 3/1987 | European Pat. Off. |
| 2120847A | 12/1983 | United Kingdom |

*Primary Examiner*—Olik Chaudhuri
*Assistant Examiner*—Long Pham
*Attorney, Agent, or Firm*—Finnegan, Henderson, Farabow, Garrett & Dunner

[57] ABSTRACT

A semiconductor integrated circuit device includes bipolar transistors, MOS FETs and a CCD in and on only one semiconductor substrate. At least emitter electrode wiring layers of bipolar transistors and one group of transfer electrode wiring layers of the CCD have a stacked structure with a low resistivity which includes a first layer of doped polysilicon and a second layer of metal silicide. These electrodes wiring layers are provided at the same time by successively depositing first and second layers on the semiconductor substrate and patterning the deposited layers.

3 Claims, 4 Drawing Sheets

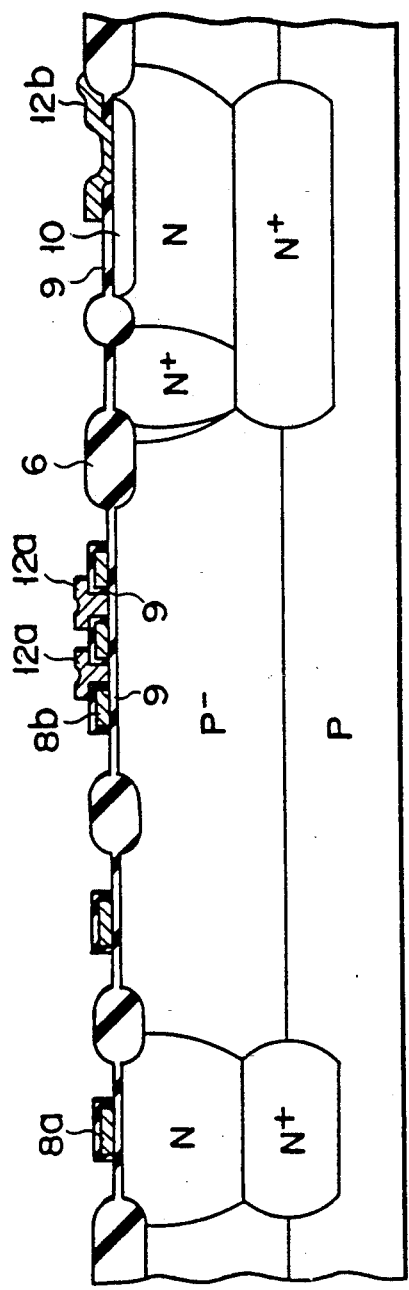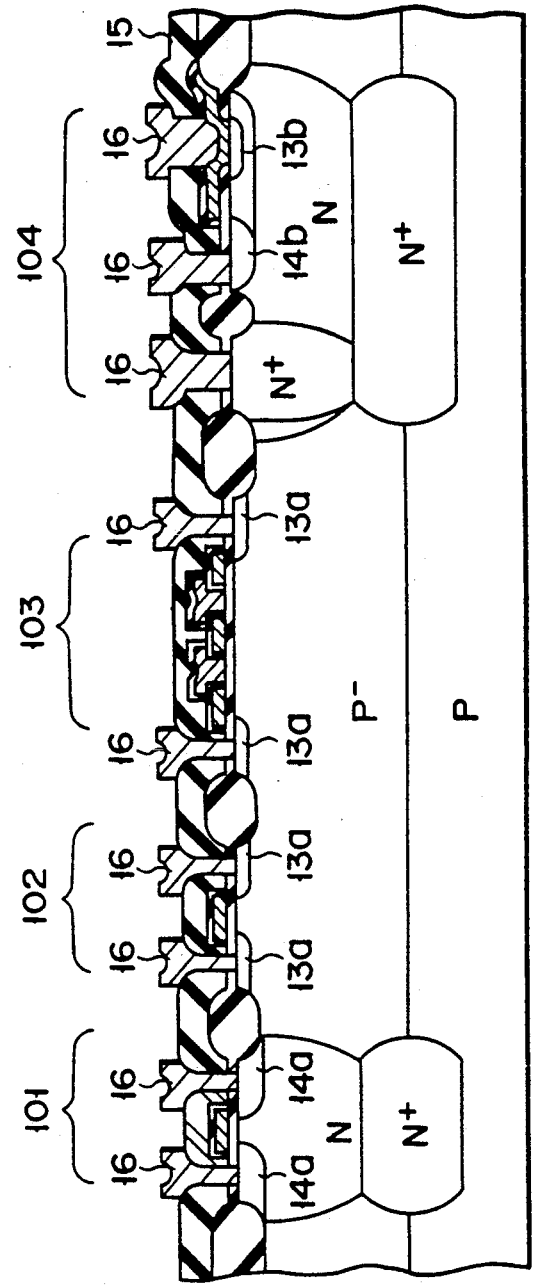
FIG. 3C
FIG. 3D

METHOD OF MAKING SEMICONDUCTOR INTEGRATED CIRCUIT DEVICE INCLUDING BIPOLAR TRANSISTORS, MOS FETS AND CCD

This is a division of U.S. patent application Ser. No. 07/609,623, filed Nov. 6, 1990, now abandoned.

BACKGROUND OF THE INVENTION

1. Field of the Invention

This invention relates to a semiconductor integrated circuit device, and more particularly, to the BI-CMOS-CCD techniques for providing bipolar transistors, MOS type field effect transistors (MOS FETs) and a CCD device on a single semiconductor substrate.

2. Description of the Related Art

In CCD type semiconductor devices, it is easy to increase the integration density, and also it is possible to reduce power consumption. Therefore CCDs have been used as solid imagers such as line sensors and area sensors, and CCD delay line elements. For example, an IC including conventional CCD delay line elements is provided in the same semiconductor substrate together with MOS FETS. FIG. 5 is a cross-sectional view schematically illustrating elements of a conventional CCD delay line IC, wherein a CCD 403 and a CMOS FET having an N-channel MOS FET 402 and a P-channel MOS FET 401 are included in a P-type silicon substrate 41, each of the devices being isolated by a field oxide film 46. A metal electrode 56 and gate electrodes 48, 52 and of the devices are interconnected to one other through electrode wiring layers, not shown, formed on an insulating film 55, thus providing a functional circuit. The CCD functions to delay signals, and the MOS FET circuits incorporated in the IC perform other associated signal processing. The capability of the MOS FET, however, is limited and signals are generally processed by an IC of another chip having bipolar transistors.

As assembly techniques, multiple chip techniques for accommodating a plurality of chips with different functions into one package to provide one functional device have been developed.

As described above, for providing a circuit system required for the signal delay function, the CCD for performing the signal delay and the bipolar IC for carrying out most signal processing cannot be formed in one chip, and must be provided by discrete ICs. Multiple chip techniques developed for this purpose employ discrete ICs in the same manner as described above and have the following problems:

(1) Since electrodes among chips are electrically connected through bonding wires and conductive layers provided on a printed circuit board, the wiring length becomes long, so that the high speed performances of discrete ICs will not be fully exhibited.

(2) Since the package becomes large, the reliability level of the device resulting from an increase in the probability of producing cracks due to an increased number of pellets, the deterioration of the humidity resisting property, etc., may be lowered.

(3) Since discrete ICs are used, it may be difficult to provide an optimum system. It may also be difficult to reduce the device size by decreasing the number of pins. In addition, there is a limit in the reduction of the power consumption of the device.

Relating to the ICs themselves, including at least one CCD type device and CMOS FETS, the MOS type transistor in general has a poor driving ability and is not good at analog signal processing. The MOS type analog circuit decreases the yield of ICs.

As has been described above, in the conventional semiconductor integrated circuit device comprised of the CCD type IC, bipolar type ICs and MOS type ICs, a plurality of discrete ICs or LSIs are combined to provide one functional system. Therefore, the prior art techniques involve a decrease in high speed performance due to bonding wires, a decrease in reliability level a difficulty in obtaining system ICs, limits in reducing device size and power consumption due to the large package size, and a decrease in yield due to MOS type analog circuits.

Further, semiconductor integrated circuit devices having multifunctions and high speed operation are generally required. Accordingly, for example, it has ordinarily been required to reduce the electrode wiring resistance and to increase the integration density of the device.

SUMMARY OF THE INVENTION

Accordingly, an object of the present invention is to provide a semiconductor integrated circuit device wherein bipolar transistors, MOS FETs and a CCD are provided in one semiconductor chip, thereby eliminating the aforesaid problems associated with prior art techniques.

Another object of the invention is to provide a semiconductor integrated circuit device having high speed operation.

A still further object of the invention is to provide a method for making a semiconductor integrated circuit device without using a complicated process.

According to one aspect of the invention, there is provided a semiconductor integrated circuit device which includes bipolar transistors, MOS FETs and a CCD in and on only one semiconductor substrate. At least emitter electrode wiring layers of the bipolar transistors and one group of transfer electrode wiring layers of the CCD have a stacked structure with a low resistivity which includes a first layer of doped polysilicon and a second layer of metal silicides. These electrode wiring layers are provided at the same time by successively depositing first and second layers on the semiconductor substrate and patterning the deposited layers.

According to another aspect of the present invention, there is provided a method of making the semiconductor integrated circuit device according to a principle incorporated in the first referred aspect of the present invention.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompany drawings, in which:

FIGS. 3A to 3D are cross-sectional views schematically illustrating a process for making the semiconductor integrated circuit device of FIG. 1;

DETAILED DESCRIPTION OF THE PREFERRED EMBODIMENTS

A semiconductor integrated circuit device according to a first embodiment of the present invention will be described with reference to FIG. 1.

Figure 1:
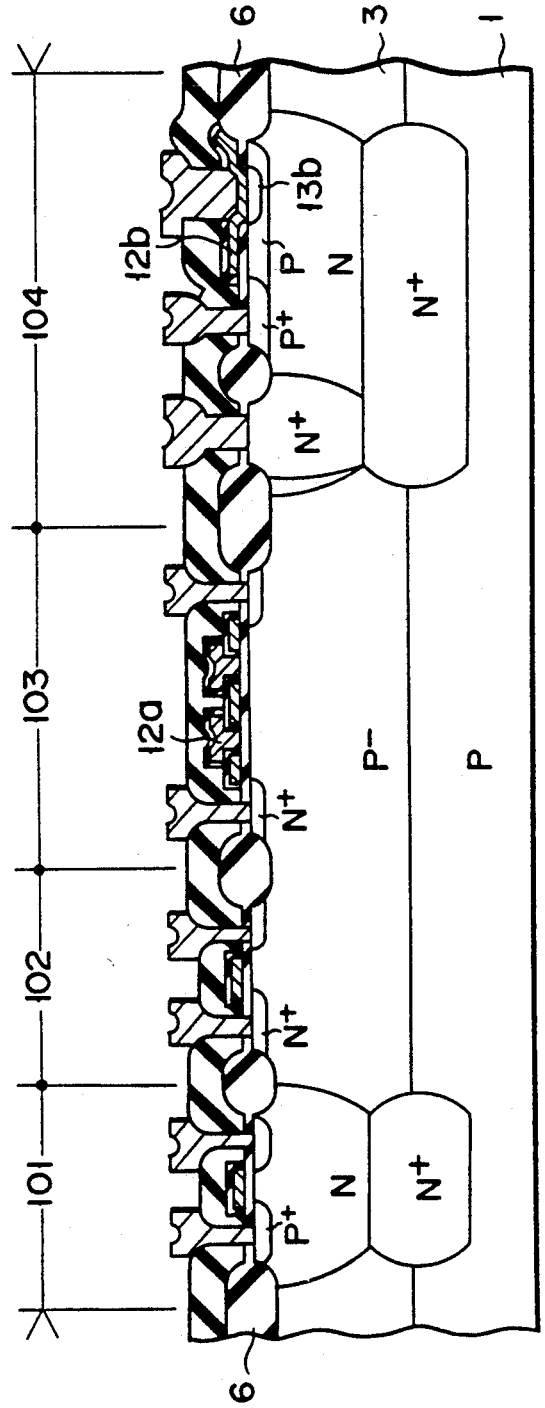
FIG. 1 is a cross-sectional view schematically illustrating a semiconductor integrated circuit device according to a first embodiment of the present invention.
Figure 2B:
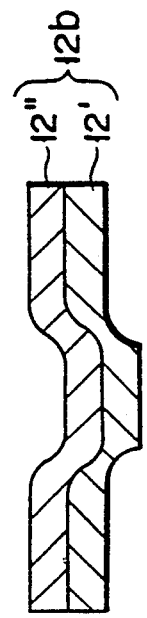
FIGS. 2A and 2B are cross-sectional views showing electrode wiring structures used as emitter electrode wiring layers of bipolar transistors, and as at least one of the gate electrode wiring layers of MOS FETs and of a CCD in the semiconductor integrated circuit device of FIG. 1.
Figure 2A:
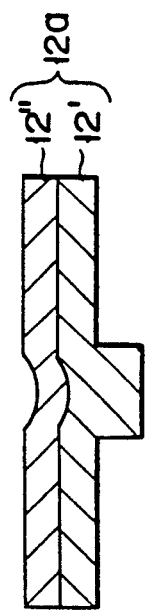

In FIG. 1, a P-channel MOS FET 101, an N-channel MOS FET 102, a CCD 103 with a two-layer gate structure, and a bipolar transistor 104 are formed on a semiconductor substrate 1 including a P-type epitaxial layer 3 and a P-type silicon substrate 1. Each element of the device is isolated through a field oxide film 6. An emitter electrode wiring layer 12b of the bipolar transistor 104 and a second group of transfer electrode wiring layers 12a of the CCD 103 are formed of a polysilicon layer (As-doped) 12' and a silicide layer (MOSi$_2$) 12" which are patterned using the same process as shown in FIGS. 2A and 2B. An N$^+$-type emitter diffused layer 13b of the bipolar transistor 104 is a shallow layer formed by using the emitter electrode wiring layer 12b as an impurity diffusion source.

Referring to FIGS. 3A to 3D, a method of making the device shown in FIG. 1 will now be described together with a detailed structure of the device.

Figure 3A:
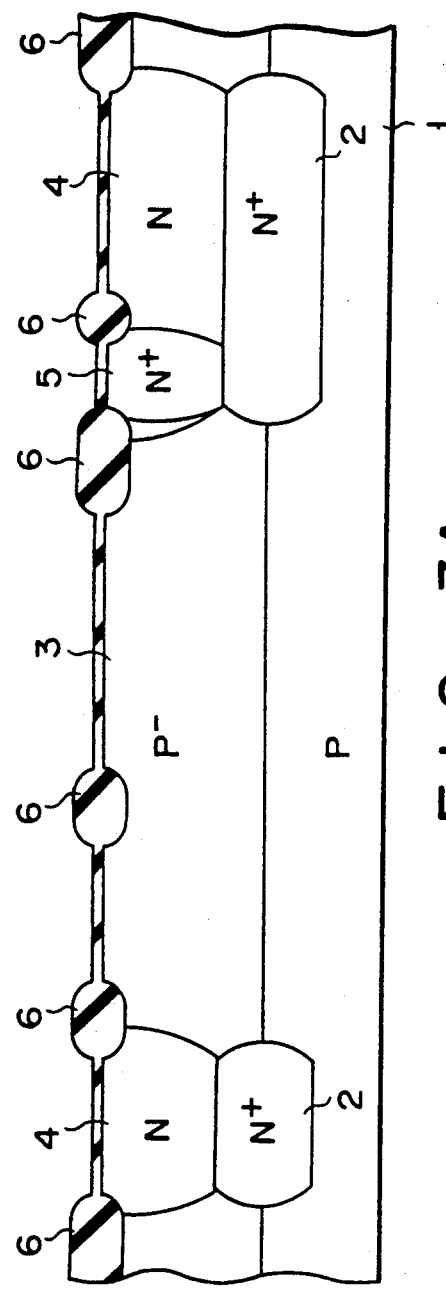

An N$^+$-type buried layer 2 is formed in the P-type silicon substrate 1 having a resistivity of the order of 18-25 Ω·cm by solid phase diffusion of antimony (Sb), followed by growing a boron-doped P-type epitaxial layer 3 to a thickness of about 3 gm thereon. By selective ion implantation and thermal diffusion, an N-type well layer 4 and a deep N$^+$-type layer 5 with a high concentration are then provided, followed by forming a field oxide film 6 by selective oxidation techniques (LOCOS) for providing an isolation structure. (FIG. 3A)

Figure 3B:
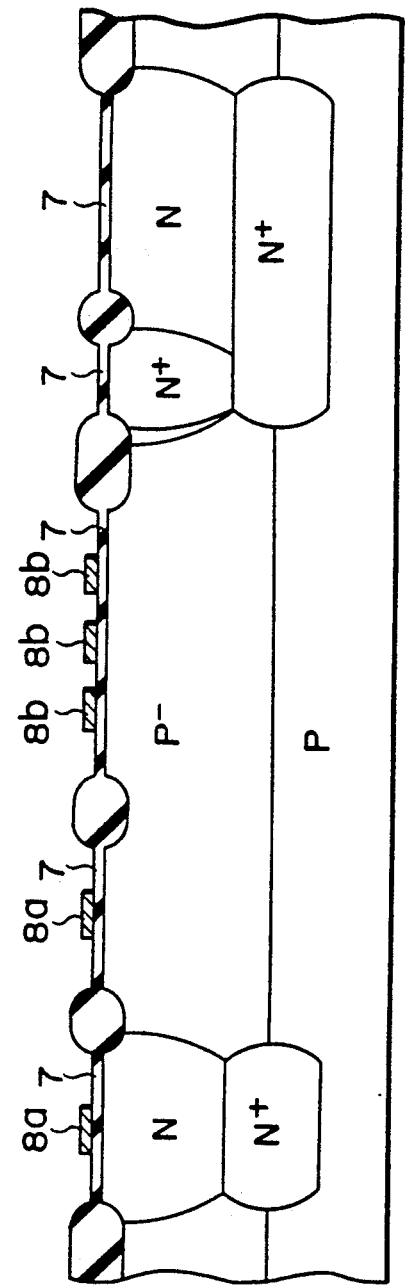

After the oxide film is removed from the substrate surface, a first gate oxide film 7 having a thickness of 500 to 700 A is formed on the substrate by the thermal oxidation technique at 950° C. Using a resist layer as a mask, the P$^-$-type epitaxial layer 3 is subjected to ion implantation to provide both a buried channel region for the CCD and channel regions for MOS FETS, respectively. An undoped polysilicon layer is subsequently deposited to a thickness of 4,000 Å followed by diffusing phosphorous at 950° C. thereinto. The doped polysilicon layer is patterned to form gate electrode wiring layers 8a of the MOS FETs and a first group of transfer electrode wiring layers 8b of the CCD. A multi-level structure comprised of a doped polysilicon layer and a silicide layer or a high melting metal layer is used as the electrode wiring layer. Using the first group of transfer electrode wiring layers 8b and a resist layer, ion implantation is performed to provide a barrier of the CCD. (FIG. 3B)

The exposed oxide film is removed by wet etching except for portions underneath the electrode wiring layers 8a and 8b. A second gate oxide film 9 is formed over the substrate surface at 950° C. by the thermal oxidation technique. Boron ions are selectively implanted into the N-type well region to provide a base region 10 of the bipolar transistor 104, using a resist layer as a mask. A window for making an emitter region in the base region 10 is formed in the oxide film 9, and a polysilicon layer is deposited on the substrate surface to a thickness of the order of 1,000 Å. Thereafter, Arsenic (As) ions are implanted into the polysilicon layer at a dose of 4×10$^{15}$ atoms/cm$^2$. Covering the doped polysilicon layer with a CVD film such as SiO$_2$, the impurity of As is diffused into the base region. For doping the polysilicon layer with an impurity, the ion implantation described above may be replaced by the use of a diffusion source of POCl$_3$ or the like, or by the deposition of a doped polysilicon. The CVD film is then removed, and a silicide of a high melting metal, for example, MOSi$_2$, is sputtered onto the polysilicon layer to a thickness of 2,500 Å. The resultant layer is patterned to provide a second group of transfer electrode wiring layers 12a of the CCD and the emitter electrode wiring layer 12b of the bipolar transistor. (FIG. 3C)

Next, arsenic (As) ions are implanted into the P$^-$-type epitaxial layer to provide both N$^+$-type regions of CCD 103 and N$^-$-type source and drain regions of the N-channel MOS FET 102, and the substrate is subjected to thermal oxidation. Boron ions are selectively implanted into the N-type well region and the base region 10 to form source and drain regions of the P-channel MOS FET 101 and an external base region of the bipolar transistor 104. The ion implantation process is carried out by self-alignment techniques using the field oxide film 6, the electrode wiring layers 8a, 8b and the emitter electrode wiring layer 12b as masks. Therefore, the distance between the external base region and the emitter region may be reduced to provide bipolar transistors having a high integration density and high speed operation.

After a CVD film (SiO$_2$) having a thickness of about 3,000 Å, a BPSG film having a thickness of about 9,000 Å, and a PSG film having a thickness of about 2,500 Å, are successively deposited on the substrate surface, the resultant structure is melted at 950° C. to perform the phosphorus gettering and the impurity diffusion for the emitter at the same time, thereby providing N$^+$-type diffused layers 13a of the N-channel MOS FET 102 and the CCD 103, the N$^+$-type emitter diffused layer 13b of the bipolar transistor 104, P$^+$-type diffused layers 14a of the P-channel MOS FET 101, and an external base region 14b of the bipolar transistor. In the formation of the N$^+$-type emitter diffused layer 13b, the N$^+$-type collector diffused layer 5 may be subjected to the similar treatment. Thereafter, known metallization processes are applied to the resultant structure to form metal electrode wiring layers 16, thereby completing a semiconductor integration circuit device. In this case, reference numeral 15 designates an interlevel insulator composed of the CVD film, the BPSG film and the PSG film. (FIG. 3D)

In the foregoing embodiment, the emitter electrode wiring layer 12b of the bipolar transistor and the second group of transfer electrode wiring layers 12a of the CCD, which have the two-layer structure, are patterned in the same process, but the invention is not limited to this. For example, the first group of transfer electrode wiring layers 122 of the CCD 103 and the emitter electrode wiring layer 126 of the bipolar transistor 104 may be patterned in the same process, more specifically, the emitter electrode wiring layer of the bipolar transistor and at least one of the electrode wiring layers of the MOS FETs and the CCD may be patterned in the same process.

Figure 4:
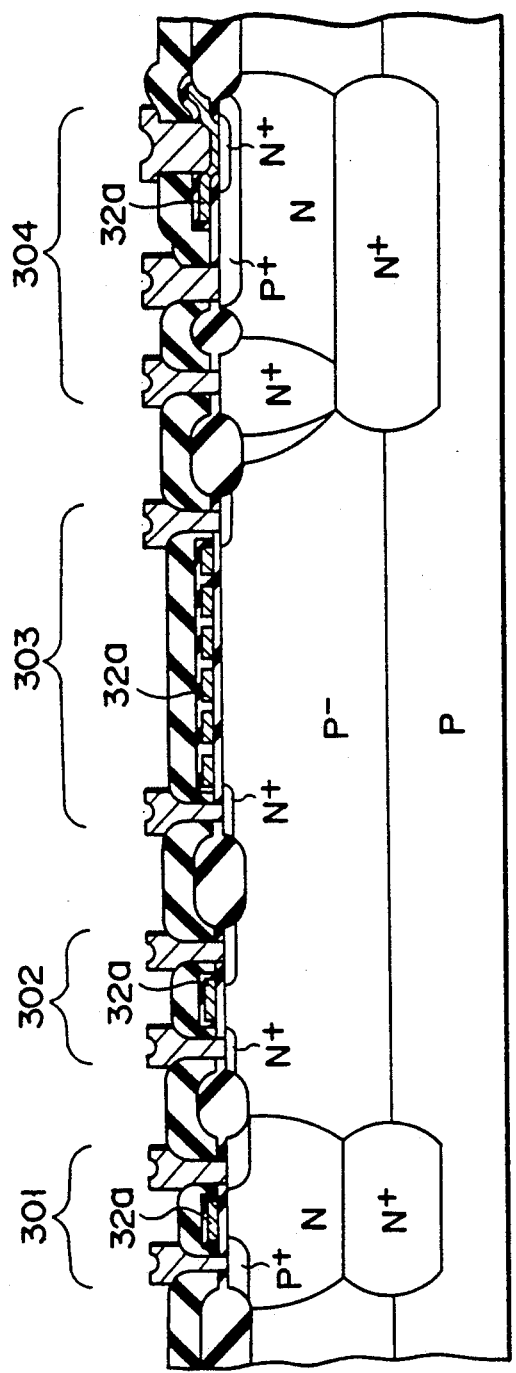
FIG. 4 is a cross-sectional view of a semiconductor integrated circuit device according to a second embodiment of the present invention.
Figure 5:
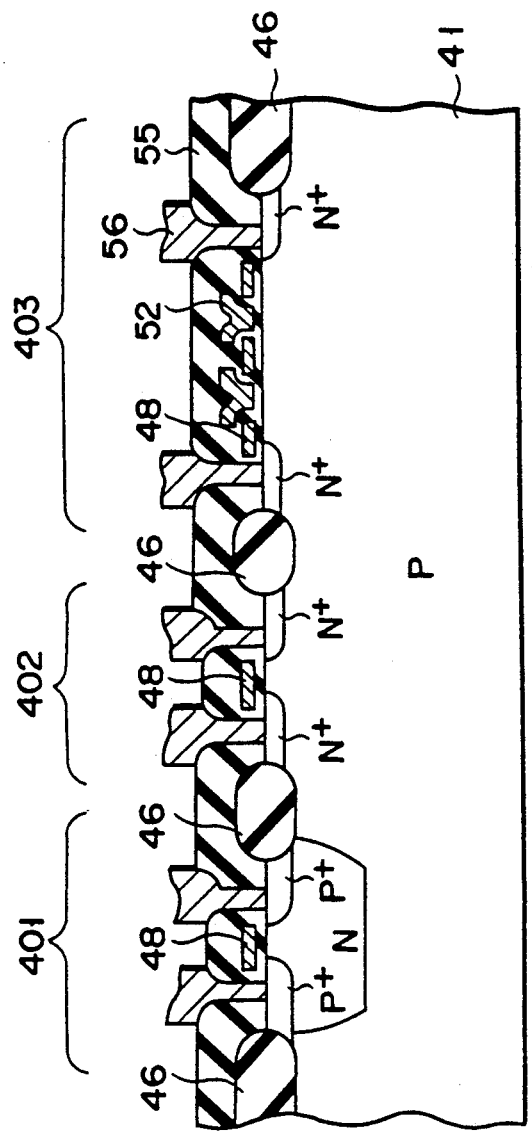
FIG. 5 shows a cross-sectional view schematically showing a prior art semiconductor integrated circuit device.

Accordingly, in the case of a CCD with a one-transfer electrode structure, all of the gate electrode wiring layers of the MOS FETs and the emitter electrode wiring layers of the bipolar transistors may be patterned in the same process. FIG. 4 is a cross-sectional view showing a second embodiment of an integrated circuit device of the present invention in this instance. A CCD 303 in FIG. 4 has a one-electrode structure. The transfer electrode wiring layers 32a of the CCD, gate electrode wiring layers 32a of the P- and N-channel MOS FETs 301 and 302, and the emitter electrode wiring layers 32a of the bipolar transistor 304 are formed of a doped polysilicon layer and a silicide layer to provide an electrode wiring structure, which is patterned at the same time. In this case, the gate electrode wiring layers of the MOS FETs and the CCD are completed by only one process, so that the device may be easily produced.

Since each of the electrode wiring layers in the embodiment is comprised of the doped polysilicon layer and the silicide layer, the resistivity may be lowered to about 3 $\Omega/\square$. The electrode material is not limited to such a composite layer. Low resistivity electrode wiring layers may be similarly obtained using a doped polysilicon layer and another high melting metal layer.

According to the semiconductor integrated circuit device of the present invention, the following advantages will be provided since at least one CCD type device, bipolar transistor, and MOS FETs are integrally formed in one semiconductor chip.

(1) Since electrical connections among the elements of the devices are performed by electrode wiring layers in place of conventional conductive layers in printed circuit boards or bonding wires, high speed performance can be improved.

(2) Since the device is provided by only one chip, unlike the prior art techniques using a plurality of chips to be arranged in one package, the probability of generating unwanted troubles such as cracks, deterioration of humidity resisting property, etc., may be reduced to improve the reliability level of the device.

(3) Since the layout pattern of the functional elements provided on the epitaxial layer can be changed without complicated processes, an optimum layout pattern corresponding to a desired system function can be selected to obtain desired system ICs. Further, since analog signal processing is carried out by the bipolar IC, a MOS IC suitable for decreasing the power consumption can be put to practical use. Accordingly, the lowered of the yield caused by the use of MOS type analog circuits can be improved. Still further, it is possible to reduce device size by decreasing the number of pins.

The emitter electrode wiring layers of the bipolar transistors and the electrode wiring layers of the CCD and the MOS type ICs are formed of low resistivity layers. High speed operation of the device can be greatly improved. Since the bipolar transistors have shallow emitters and a reduced distance between the external base and the emitter, transistors adapted to high speed operation can be provided. Further, use of electrode wiring layers may achieve a high integration density of electronic circuits.

As has been described in detail, since bipolar transistors, MOS FETs and at least one CCD are provided in the one chip and low resistivity materials are used as the electrode wiring layers of the elements, the problems associated with prior art techniques will be eliminated thereby attaining high speed operation, high system integration, and low power consumption. Accordingly, semiconductor integrated circuit devices having high reliability will be provided with high yield.

It is further understood by those skilled in the art that the foregoing description is preferred embodiments of the disclosed device and that various changes and modifications may be made in the invention without departing from the spirit and scope thereof.

What is claimed is:

1. A method of making a semiconductor integrated circuit device comprising the steps of:
   (a) preparing a semiconductor substrate of a first conductivity type having a well region of a second conductivity type for providing a bipolar transistor;
   (b) forming a field oxide film in said semiconductor substrate to define first and second regions for providing a charge coupled device (CCD) and a MOS FET, respectively;
   (c) removing an unwanted portion of the field oxide film from said well region and said first and second regions;
   (d) forming an oxide film over said well region and said first and second regions to provide a gate oxide film on said first and second regions and said well region;
   (e) selectively introducing a first dopant impurity of said first conductivity type into said well region to provide a base region;
   (f) selectively removing said gate oxide film from said base region to define an emitter portion;
   (g) successively depositing a first conductive layer of doped polysilicon and a second conductive layer of high melting material over said well region and said first and second regions to provide a composite conductive layer thereon;
   (h) patterning said composite conductive layer to simultaneously provide an emitter electrode for said bipolar transistor, transfer gate electrodes for said CCD, and a gate electrode for said MOS FET;
   (i) selectively removing said gate oxide film from said base region to define a base contact portion;
   (j) selectively introducing said first dopant impurity into said base contact portion using said field oxide film and said emitter electrode as a mask to provide a base contact therein;
   (k) selectively introducing a second dopant impurity of said second conductivity type into said first and second regions; and
   (l) subjecting said semiconductor substrate to a heat treatment to diffuse said first dopant impurity contained in said first conductive layer into said base region to provide an emitter region thereon.

2. The method according to claim 1, wherein said semiconductor substrate includes a separate well region of said second conductivity type for providing a separate MOS FET.

3. The method according to claim 1, wherein said second conductive layer of high melting material includes a metal silicide.

* * * * *